United States Patent
Sandstrom

(10) Patent No.: US 6,529,266 B1
(45) Date of Patent: Mar. 4, 2003

(54) DEVICE AND METHOD FOR FLAT HOLDING OF A SUBSTRATE IN MICROLITHOGRAPHY

(75) Inventor: Torbjorn Sandstrom, Pixbo (SE)

(73) Assignee: Micronic Laser Systems AB, Taby (SE)

(*) Notice: Subject to any disclaimer, the term of this patent is extended or adjusted under 35 U.S.C. 154(b) by 0 days.

(21) Appl. No.: 09/529,988

(22) PCT Filed: Nov. 13, 1998

(86) PCT No.: PCT/SE98/02051

§ 371 (c)(1), (2), (4) Date: Jul. 10, 2000

(87) PCT Pub. No.: WO99/26113

PCT Pub. Date: May 27, 1999

(30) Foreign Application Priority Data

Nov. 14, 1997 (SE) ................................. 9704193

(51) Int. Cl.⁷ ..................... G03B 27/58; G03B 27/42; G03B 27/62
(52) U.S. Cl. ..................... 355/72; 355/53; 355/75
(58) Field of Search ................. 355/72–76, 53, 355/67, 30; 318/649, 640; 310/10, 12; 378/34, 35

(56) References Cited

U.S. PATENT DOCUMENTS

| | | | | |
|---|---|---|---|---|
| 4,425,038 A | * | 1/1984 | La Fiandra et al. | 355/73 |
| 4,737,824 A | * | 4/1988 | Sakai et al. | 355/53 |
| 5,761,023 A | * | 6/1998 | Lue et al. | 361/234 |
| 6,183,523 B1 | * | 2/2001 | Hurwitt et al. | 29/25.01 |

FOREIGN PATENT DOCUMENTS

| | | |
|---|---|---|
| JP | 61094324 | 5/1986 |
| JP | 61094325 | 5/1986 |
| JP | 361094324 A * | 5/1986 |
| JP | 1155354 | 6/1989 |

* cited by examiner

Primary Examiner—Henry Hung Nguyen
(74) Attorney, Agent, or Firm—Birch, Stewart, Kolasch & Birch, LLP

(57) ABSTRACT

A system for holding substrates in microlithography to prevent flatness errors. Deflections cause by gravity bend the surface of the substrate. Spacer elements are provided between the table and the substrate to hold the substrate in a horizontal position. The rim of the substrate is sealed, so that a chamber is formed containing air. Different air pressure can be provided on different sides of the substrate in order to prevent deflection.

19 Claims, 3 Drawing Sheets

DEVICE AND METHOD FOR FLAT HOLDING OF A SUBSTRATE IN MICROLITHOGRAPHY

This application is the national phase under 35 U.S.C. 371 of PCT International Application No. PCT/SE98/02051 which has an International filing date of Apr. 24, 2000, which designated the United States of America.

FIELD OF THE INVENTION

The present invention relates to a device and a method for holding substrates in microlithography, such as writing of, measuring of or printing from patterns on large flat substrates, in particular large-area photomasks for production of visual display devices such as TFT-LCD screens for portable computers. To the extent that other implements such as the display glass panels themselves, printed circuit boards or semiconductor reticles or wafers pose the same problem of maintaining the geometrical precision across several types of equipment, the invention can be applied there too.

BACKGROUND OF THE INVENTION

In microlithography, and especially in microlithographic writing of large areas, as is known from e.g. EP 0 467 076 by the same applicant, flatness errors frequently occur due to the substrate not being totally flat during the writing process.

It is known in the art that a flat workpiece requiring the utmost precision is deformed when it is clamped to a stage or workpiece holder. For the discussion we consider a flat glass plate with the size 600×800×8 mm, such as a photomask for production of TFT-LCD display screens. The xy precision in production plate needs to be of the order of 0.3 $\mu$m (3 sigma or 99.7% confidence) everywhere when compared to an ideal coordinate grid. In a metrology situation the precision should, if normal metrology standards are to be maintained, be three times better, i.e. 0.1 $\mu$m.

If the glass plate is placed on a horizontal table, even minute deviations from flatness in the table affect the geometrical precision of a pattern written on the glass. Micron-sized particles between the glass and the table also make a measurable deformation of the glass. Therefore a metrology system, and to a lesser extent a pattern generator and an exposure station using the mask, must have a stage that is built to extreme precision and kept meticulously clean. A fingerprint on the stage can ruin the precision.

However, even with a perfect stage the precision is limited by the flatness of the glass, since large glass plates are compliant enough to make the surface resting on the stage follow the stage surface, fully or partially. The problem becomes intractable when one realises that different manufacturers support the plates differently and that in different types of equipment different types of clamping is required or technically desirable. An example is an exposure station where the mask has to be clamped by the edges since no supports are allowed to obstruct the light transmission through the mask within the patterned area. Furthermore there may be different preferences among manufacturers and different technical requirements on the orientation of the patterned glass plate: horizontal with the pattern up, with the pattern down or standing or hanging more or less vertical.

It is known in prior art to support the glass on three points. Unfortunately this works only for small glass plates such as semiconductor reticles which are stiff enough not to bend excessively under the gravitational force.

A deflection, e.g. caused by the attraction of gravity, results in a expansion on the bottom side of the substrate and a compression on the top side, as is shown in FIG. 2. Hereby there is an angle β present between the intended path for the laser rays, perpendicular to the substrate surface, and the actual path. The error ϵ at the surface of the substrate between the position intended to be hit by the laser light and the position actually hit, is then:

$$\varepsilon = \frac{t}{2}\beta \quad (1)$$

where t is the thickness of the substrate.

This expression is approximately the same as:

$$\epsilon = \Delta h \cdot t / 2a \quad (2)$$

where $\Delta h$ is the deflection of the substrate and a is half the length of the substrate (i.e. the length is $2a$). In a typical situation t could be 8 mm, a 400 nm and $\Delta h$ 1 mm. The error would in this case be 10 $\mu$m, which is a most significant error in the intended application.

The flatness error is to a large extent a linear problem, which relatively easily can be compensated for electronically. The remaining part, which is normally about 20% of the total error and therefore most significant, is however non-linear, which makes it difficult to deal with.

The flatness error also give rise to a problem with keeping the focus of the laser beam, while the depth of the focus is limited.

BRIEF SUMMARY OF THE INVENTION

It is therefore an object of the present invention to provide a device and a method for holding substrates in microlithography whereby the flatness error problem is at least reduced.

This object is obtained with the invention such as it is being defined in the attached claims.

The present invention relates to a method and device for maintaining geometrical precision in the case of a non-ideal support structure holding a non-flat unknown substrate, oriented arbitrarily to the gravitation force, whereby the deflection of the substrate is neutralised with a pressure difference between the different sides of the substrates.

In a companion application the method to completely control both clamping and shape-induced errors, by characterising the glass plates and the equipment independently and compute the distortion for the combination is described, i.e. it uses a mathematical model to correct for actual errors in existing equipment. Compared to the present invention the method of the companion application is applicable without the requirement that the equipment is specially built for this purpose, but on the other hand the present invention is simpler and easier to use.

Although the invention is applicable to different sizes of plates of glass and other materials its first application is to photomasks in large-area lithography. The plates with size up to one meter are made from fused silica for reasons of thermal expansion and polished flat. The alternative to the invention, and to the invention in the companion application, is to make plates that are flat enough to be considered ideal. Such plates would be incredibly expensive, while the present invention does not require flatness above that needed for other reasons, such as focus control. Furthermore focus control can be made better with the present invention.

PREFERRED EMBODIMENTS

Figure 1:
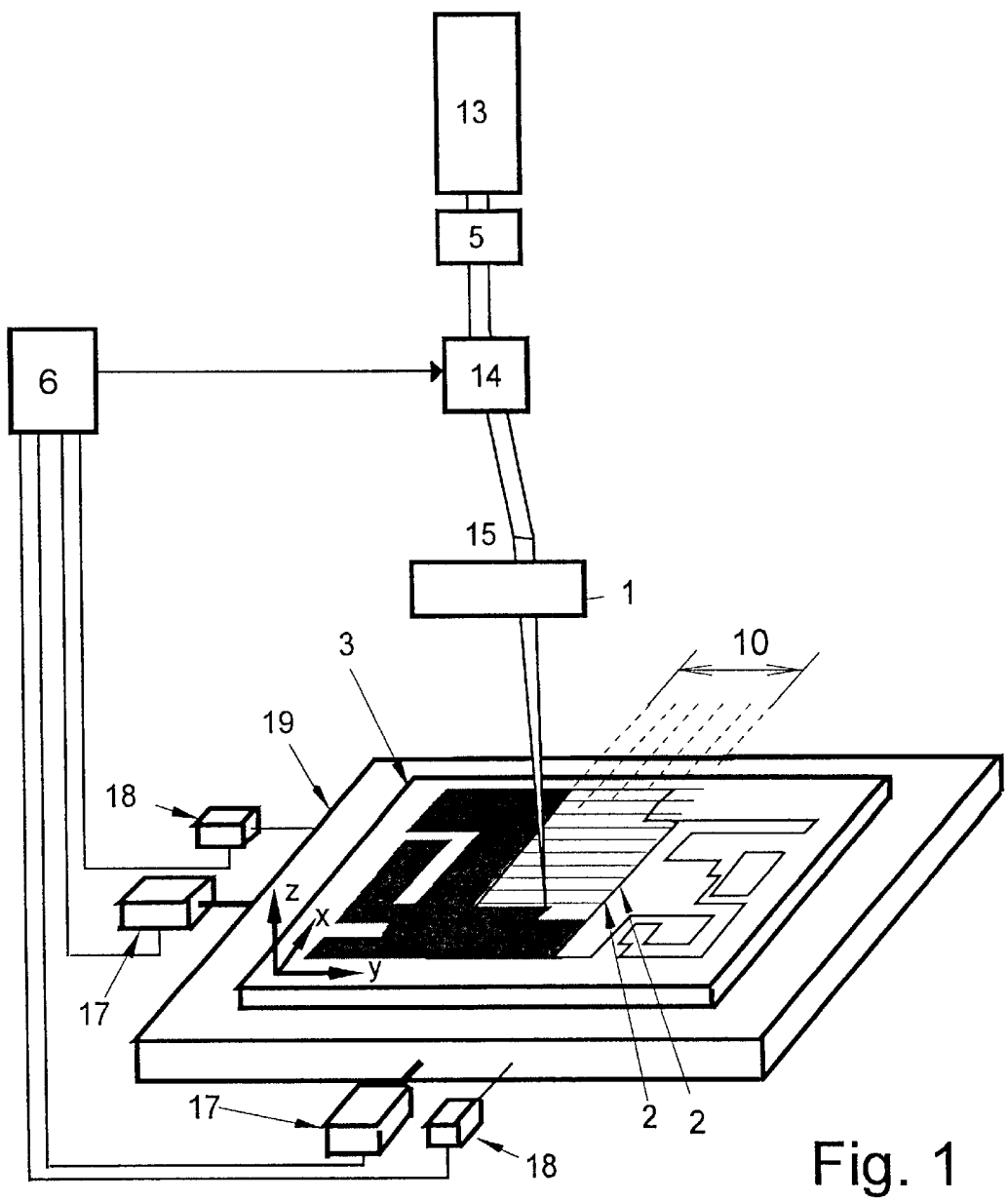
FIG. 1 shows an apparatus for producing a surface pattern or structure according to the prior art.
Figure 2:
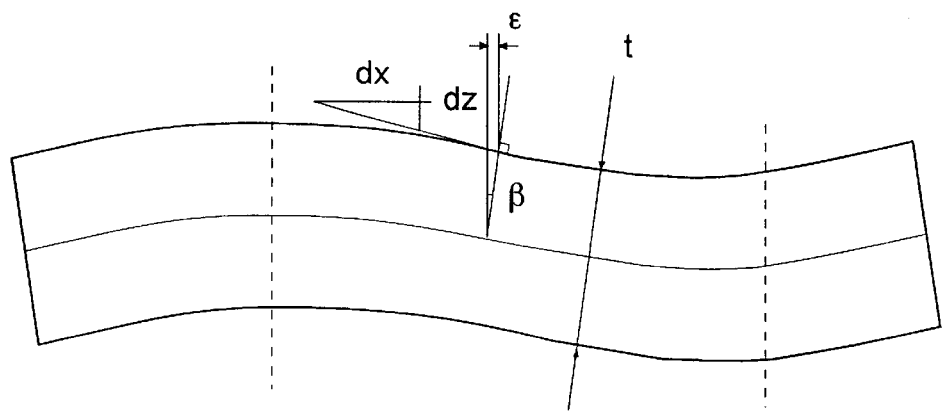
FIG. 2 shows the flatness error in a substrate, for the purpose of example.

Reference will now be made to FIG. 1 showing an apparatus according to the prior art for producing surface patterns or structures on photosensitiv coated substrates. In the illustrated embodiment, the substrate 3 is disposed on an object table 19 which is movable in the X- and Y-directions. A writing head with a focusing lens 15 and a deflector device 14 is arranged to be stationary in the X- and Y-directions. The object table is made of stone, glass or other suitable material.

A laser beam source 13 produces a laser beam which is modulated in regard to its power and in particular its intensity by a modulator device 5. The focusing lens 15 focuses on the laser beam and forms a focused laser beam as indicated at 1, which is directed on to the surface of the substrate 3.

For monitoring the positioning of the object table 19, the apparatus has position monitoring devices 18x and 18y which monitor the positioning of the object table 19 in the X- and Y-directions relative to the writing head (deflector device 14 and focusing lens 15). Together with electric motors 17x and 17y, the position monitoring devices 18x and 18y form a servo mechanism which produces the precisely controlled movement of the object table 19.

The servo mechanism produces stripes 10 of a given width when the laser beam 1 scans along the scan lines 2 in the X-direction at a constant speed. When a respective stripe 10 is completed, the X-servo mechanism performs a retrace stroke movement into the starting position and the object table 19 is then moved in the Y-direction by the width of a stripe by the electric motor 17y. The apparatus is controlled by a controller unit 6.

In the case where the object table is made of glass or other transparent material, the apparatus may be of the form where the laser beam is transmitted through the pattern and the object table and to a secondary area underneath.

Figure 3:
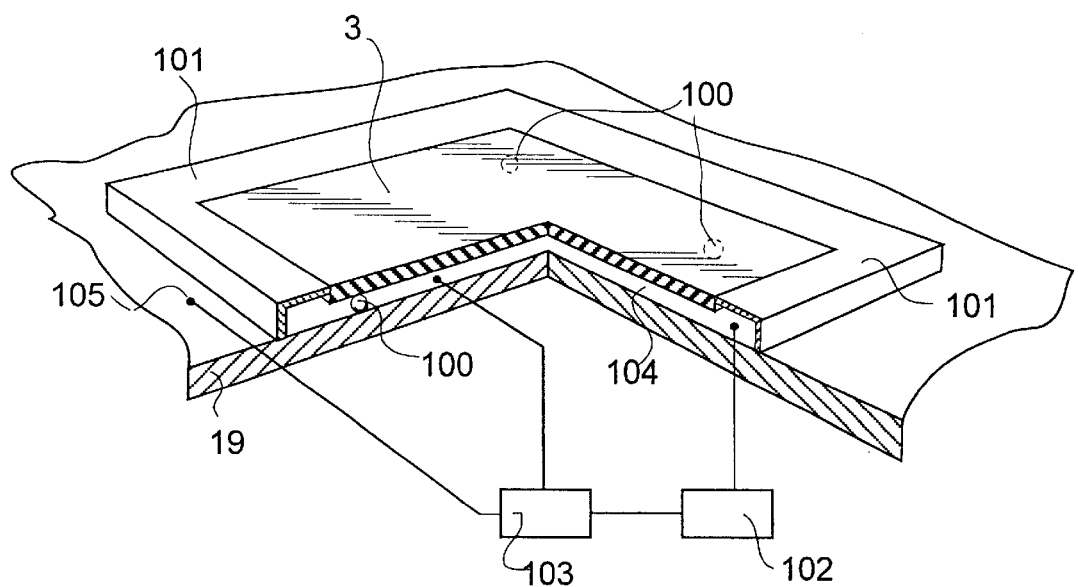
FIG. 3 shows a support for holding substrates according to an embodiment of the present invention.

Reference will now be made to FIG. 3, showing a support for the substrate according to an embodiment of the invention in more detail.

Between the object table 19 and the substrate 3 there are spacer elements 100. The function of the spacer elements is to hold the substrate in a horizontal position at a distance relative to the surface of the object table, and at the same time hold the substrate to prevent vertical movement of the substrate relative to the object table. This can be achieved by some sort of adhesive, by electromagnets, by mechanical clamping or by other suitable means. Most preferably, however, the spacers comprises suction cups or vacuum cups directed towards the substrate. Preferably the spacer elements also prevents movement of the substrate in the lateral directions relative to the object table.

The distance between the substrate and the object table is, however, preferably comparatively small, e.g. in the vicinity of 100 microns. Hereby the air which is enclosed between the object table and the substrate has a damping effect on oscillations in the substrate.

Several alternative embodiments regarding the number of spacer elements and the distribution of the same are possible. Few spacer elements is however preferred, while the risk of deviations caused by contaminations and the like hereby is reduced. In a embodiment, shown in FIG. 3, three spacer elements is used, evenly distributed over the substrate area.

In the embodiment described above the spacer elements are assumed to have relatively small extension in the plane of the substrate. This is however not necessary, and the spacer elements may on the contrary have a relatively large extension. For example the spacer element may be a frame extending around the substrate.

Figure 4:
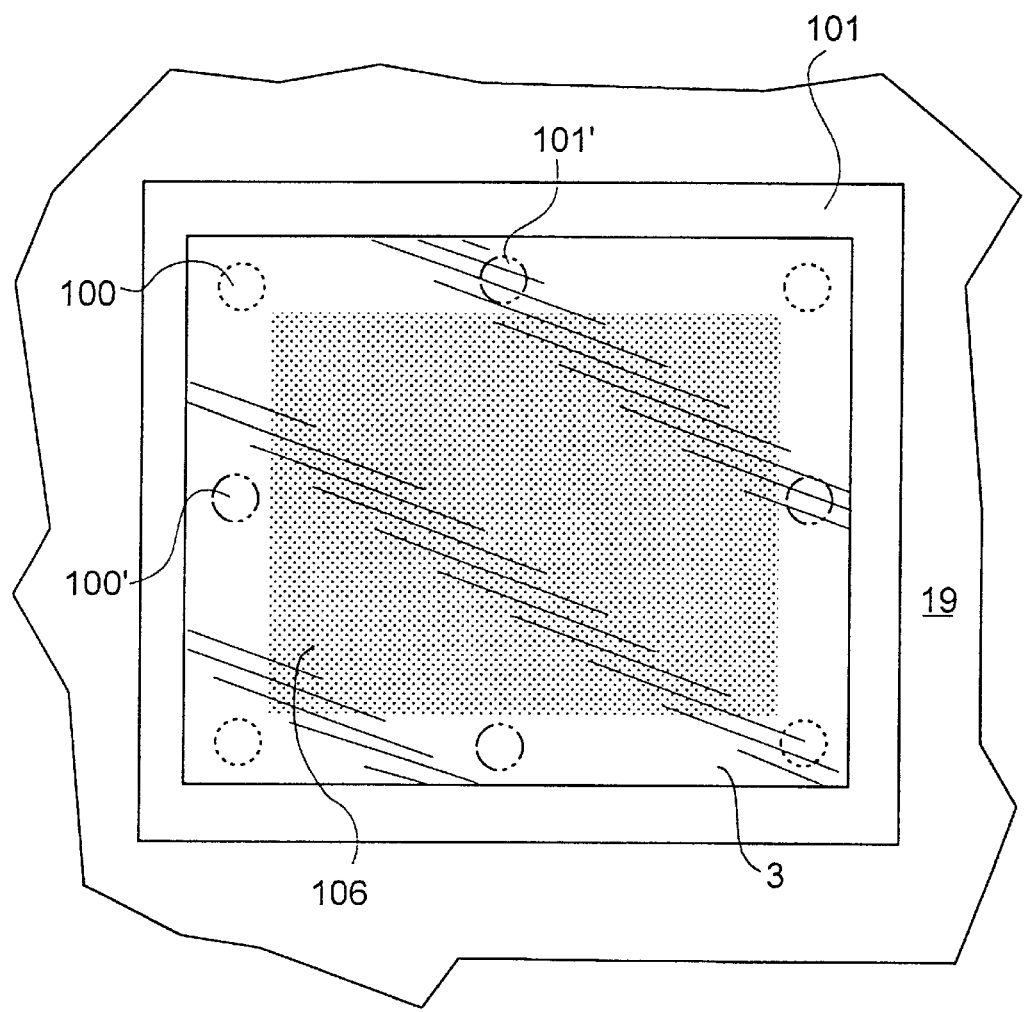
FIG. 4 shows a elevational view of an alternative embodiment of the invention.

In FIG. 4 an alternative, preferred embodiment is shown, where four spacer elements 100 are used. The spacer elements 100 are preferably placed near the corners of substrate 3, and most preferably outside the pattern area 106. The spacers may, however, be placed inside the writing area. Additional spacers 100' can be placed between the corner spacers 100.

If more than three spacers are used, the height of the spacers might be individually adjustable, whereby the height of each spacer element may be adjusted so that the load in all the elements are the same, or correspond to the load computed for a non-deformed substrate. This can also be used to reduce inherent curvatures in the substrate, and hereby achieve better focus of the laser beam.

To the rim of the substrate there is, again referring to FIG. 3, attached a seal 101, which preferably is airtight. Hereby the space between the substrate and the surface of the object table is a chamber separated from the environment, and accordingly there can be a pressure difference between the different sides of the substrate. Further, a pump 102 is provided, the output from which is connected to the chamber.

The pressure difference makes it possible to compensate for, and thereby minimize, the deflection of the substrate. The deflection can be due to the attraction of gravity, especially when the substrate is held in a horisontal position. The deflection can however also be caused by attention of the pellicle, by inherent. curvation in the substrate, etc.

In the shown embodiment in FIG. 3 the seal 101 is a frame, surrounding the substrate, preferably with a close fit there between. In this embodiment the switch of substrates is easy as long as the substrates are of the same size. If, however, substrates of different sizes are to be used, different frames have to be used accordingly.

Alternatively the sides of the frame may be displaceable on the object table, thus allowing the size of the frame to be varied. Hereby the same frame can be used for several different substrates.

The seal 101 may also be a frame intended to be placed between the substrate and the object table, i.e. a frame which has a smaller extension than the substrate.

Alternatively the seal is not air tight, whereby there is a flow of air out from the chamber to the surrounding. As long as this air flow out from the chamber is relatively small a pressure difference between the chamber and the surrounding can still be achieved, but naturally the air flow in to the chamber, provided by the pump, must be higher in cases where the seal is not air tight.

As long as the opening between the chamber and the surrounding is small it is even possible to eliminate the seal completely.

The pump 102 is controlled by a controller unit 103.

The controller unit controls the pressure in the chamber, and thereby the pressure difference between the different sides of the substrate.

The controller unit may control the pressure in a number of ways. On way to control the pressure difference is to calculate needed pressure difference from known parameters such as the material of the substrate, the thickness and size of the substrate etc. The pressure in the chamber and in the surrounding is then measured by pressure sensors inside and outside the chamber, and the pump is controlled is such a way that the predetermined pressure difference is achieved.

Another way to control the pressure is to measure the distance between the substrate and the object table in at least one point, whereby the pump is controlled in such a way that the deflection is minimized or held at a predetermined value.

A third way to control the pressure in the chamber is to measure the force by which the substrate acts on the supports.

The controller unit can also be adapted to actively regulate the pressure in the chamber in order to damp oscillations in the substrate. This regulation can relate to the distance between the substrate and the object table, provided by e.g. a distance sensor. Hereby the distance provided by the sensor is compared with a preset distance value, and the controller unit is adapted to eliminate or at least minimize the difference.

Alternatively, the controller unit can be adapted to react on the speed of the substrate, i.e. the first order derivative of the distance.

For an example a substrate of the size 0.6 m×0.8 m may be used. The thickness is normally about 8 mm, and the density 2500 kg/$M^3$. The force of gravity is hereby 94 N, and the needed pressure difference to compensate for this is 196 Pa, or about 0,002 atm. As can be seen by this example, the needed pressure difference is very low even when large substrates are used.

A further aspect of the present invention is that when it is used in at least one apparatus in a series of at least two apparatuses wherein the substrate is intended to be treated, i.e. in which the substrate will be written, measured and so on, the differences between the conditions experienced by the substrate in the different apparatuses can be minimized. Hereby the setting problems in the different apparatuses, where the substrate may be held horizontal in one and vertical in another, can be avoided.

This invention is not limited to the preferred embodiments. For example it is possible to use other gases than air to achieve the pressure differences, the number of spacer elements and the placement of the same can be changed, other alternatives to controlling the pressure are possible, etc. The invention may also be applicable to substrates that are held in an almost vertical position as well as in a horizontal position.

Such obvious ways of modifying the invention must be considered possible without departing from the scope of the invention, such as it is defined by the following claims.

What is claimed is:

1. A device for holding of a substrate (3) in microlithograph comprising:
    a substrate support (19),
    at least one pumping device (102)
    a control unit (103) for controlling said pumping device and (103) connected to provide for different pressures on different sides of the substrate (3) and to control the pressure difference to neutralize deflection of the substrate caused by the attraction of gravity,
    wherein the support is a support table (19) for holding the substrate (3) in a non-vertical position, including fastening means (100) for holding the substrate (3) and gas sealing means (101) for making the space between the substrate (3) and a surface of said table separated from the surrounding wherein the fastening means holds the substrate in at least four points, whereby the fastening means and at least one of the points is adjustable in height relative to the support table.

2. A device according to claim 1, wherein the fastening means (100) holds the substrate by vacuum.

3. A device according to claim 2, wherein the fastening means holds the substrate with suction cups.

4. A device according to claim 1, wherein the distance between the substrate (3) and the table (19) surface is very small compared to the dimensions of the substrate (3).

5. A device according to claim 4, wherein the distance between the substrate and the table surface is less than 1 mm.

6. A device according to claim 5, wherein the distance between the substrate and the table surface is about 100 $\mu$m.

7. A device according to claim 1, wherein the control unit (103) actively regulates the pressure, to damp oscillations in the substrate (3).

8. A device according to claim 7, wherein the control unit (103) damps dynamic oscillations according to a detected oscillation speed of the substrate (3).

9. A device according to claim 8, wherein the control unit (103) damps dynamic oscillations through relating a detected position value of the substrate (3) with a pre set value.

10. A device according to claim 1, wherein the sealing means comprises a sealing frame (101) in which the substrate (3)is placed, with a close fit there between.

11. A device according to claim 10, wherein the sides of the frame (101) are displaceable relative each other, whereby the size of the frame is adjustable in order to fit different substrate sizes.

12. A device according to claim 1, wherein the non-vertical position is an essentially horizontal position.

13. A method for holding of a substrate (3) in microlithography on a substrate support comprising:
    holding the substrate (3) in a non-vertical position by fastening means (100), the fastening means holding the substrate in at least four points whereby the fastening means in at least one of the points is adjustable in height relative to the substrate support;
    providing different pressures on different sides of the substrate, and
    controlling the pressure difference to neutralize a deflection of the substrate caused by the attraction of gravity.

14. A method according to claim 13, wherein the substrate is held by vacuum.

15. A method according to claim 14, wherein the substrate is held with suction cups.

16. A method according to claim 13, wherein the pressure difference is actively regulated to damp oscillations in the substrate (3).

17. A method according to claim 13, wherein the non-vertical position is an essentially horizontal position.

18. A device for holding of a substrate (3) in microlithography, comprising:
    a substrate support (19),
    at least one pumping device (102)
    a control unit for controlling said pumping device and (103) connected to provide for different pressures on different sides of the substrate (3) and to control the pressure difference to neutralize deflection of the substrate caused by the attraction of gravity, wherein the support is a support table (19) for holding the substrate (3) in a non-vertical position, including fastening means (100) for holding the substrate (3) and gas sealing means (101) for making the space between the substrate (3) and a surface of said table separated from the surrounding wherein the fastening means has a limited number of holding points, each having a relatively small extension in the plane of the substrate.

19. A device according to claim 18, wherein the fastening means (100) holds the substrate (3) in at least three holding points, distributed over the substrate area.

* * * * *